United States Patent [19]

Yasue et al.

[11] Patent Number: 5,723,982
[45] Date of Patent: Mar. 3, 1998

[54] APPARATUS FOR ANALYZING THIN FILM PROPERTY

[75] Inventors: Takao Yasue; Tadashi Nishioka, both of Itami, Japan

[73] Assignees: Mitsubishi Denki Kabushiki Kaisha, Tokyo; Ryoden Semiconductor System Engineering Corporation, Hyogo, both of Japan

[21] Appl. No.: 506,856

[22] Filed: Jul. 25, 1995

[30] Foreign Application Priority Data

Aug. 22, 1994 [JP] Japan ................... 6-196576

[51] Int. Cl.⁶ ................... G01R 31/26
[52] U.S. Cl. ................... 324/765; 250/306; 324/719; 324/754
[58] Field of Search ................... 324/754, 765, 324/719, 110; 250/306

[56] References Cited

U.S. PATENT DOCUMENTS

| | | | |
|---|---|---|---|
| 5,041,783 | 8/1991 | Ohta et al. | 324/754 |
| 5,289,004 | 2/1994 | Okada et al. | 250/306 |
| 5,336,887 | 8/1994 | Yagi et al. | 250/306 |
| 5,436,448 | 7/1995 | Hosaka et al. | 250/306 |
| 5,517,128 | 5/1996 | Henninger | 324/765 |

OTHER PUBLICATIONS

Fukano et al, "Scanning Force/Tunneling Microscopy As A Novel Technique For The Study Of Nanameter–Scale Dielectric Breakdown Of Silicon Oxide Layer", Japanese Journal of Applied Physics, vol. 32, No. 1B, 1993, pp. 290–293 Jan. 1993.

Primary Examiner—Ernest F. Karlsen
Assistant Examiner—Anh Phung
Attorney, Agent, or Firm—Leydig, Voit & Mayer, LTD

[57] ABSTRACT

A method and apparatus for measuring electrical characteristics of a thin surface layer of a sample such as a semiconductor element. A triangular pulse wave of is applied between the sample and a probe needle on a cantilever. By measuring current that flows through the thin surface layer of the sample using the probe needle, I/V characteristics are obtained. A control circuit keep constant the clearance between the probe needle and the thin surface layer of the sample by applying a voltage to a piezoelectric element that supports the sample. I/V characteristics are then measured at a plurality of test points on the thin surface layer of the sample.

4 Claims, 15 Drawing Sheets

SURFACE ROUGHNESS IMAGE (AFM)
(BRIGHTER SHADING = HIGHER PROJECTIONS)

SURFACE CURRENT DISTRIBUTION IMAGE (CITS)
BIAS VOLTAGE +0.05V
(UNSHADED = LARGE CURRENT)

I/V CHARACTERISTICS
(1,2,3 CORRESPONDING RESPECTIVELY TO +1, +2, +3 IN FIG.3A

VOLTAGE APPLIED TO SAMPLE +0.1V

SURFACE ROUGHNESS IMAGE
(AFM)

SURFACE CURRENT DISTRIBUTION
IMAGE (CITS)
BIAS VOLTAGE +29V

DIELECTRIC BREAKDOWN
LOCATIONS

I/V CHARACTERISTICS AT
DIELECTRIC BREAKDOWN
LOCATIONS

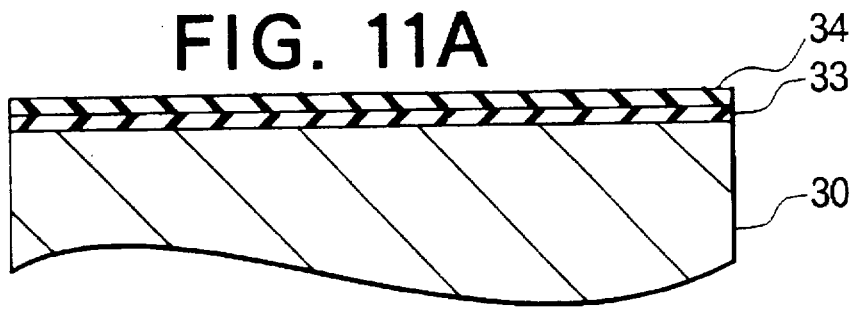
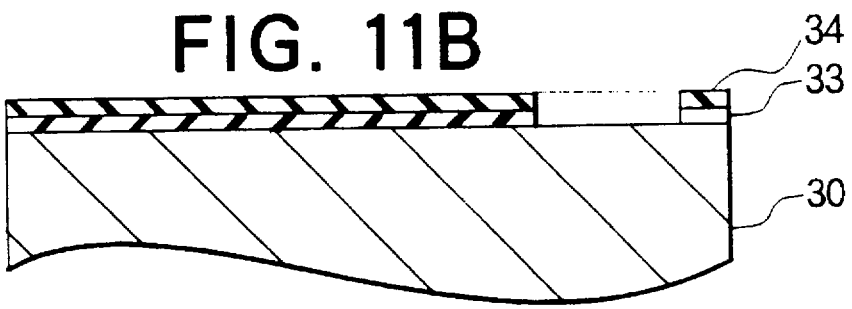
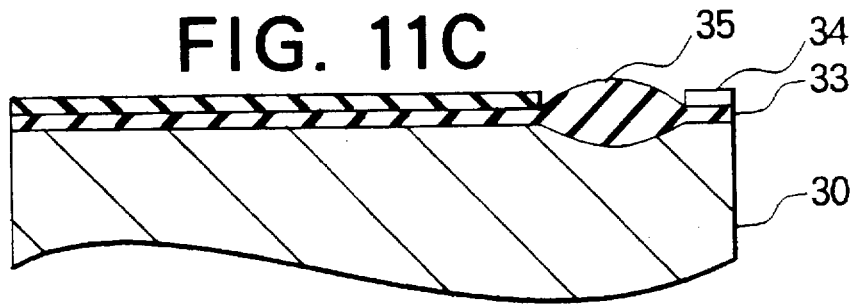
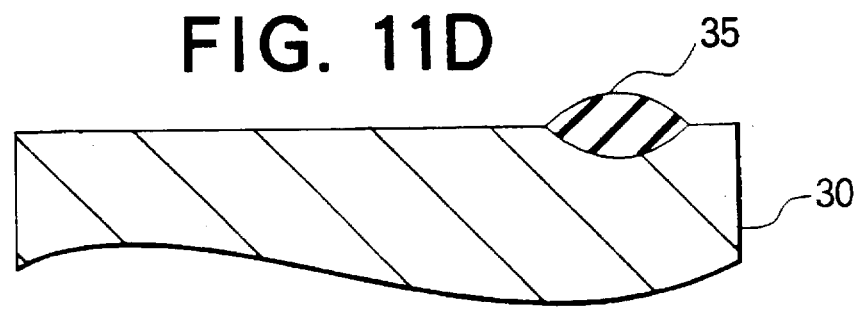
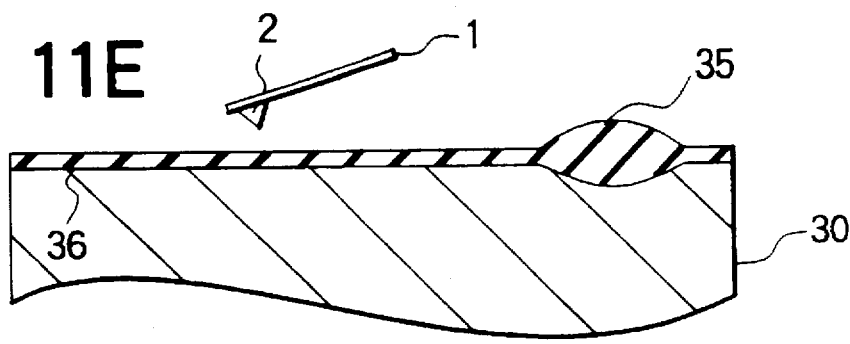

APPARATUS FOR ANALYZING THIN FILM PROPERTY

BACKGROUND OF THE INVENTION

Field of the Invention

The present invention relates to a method and apparatus for analyzing a property of a thin film on the surface of a sample and, in particular, for measuring electrical characteristics of the sample. The present invention also relates to a method of manufacturing semiconductor structures using the method for analyzing the property.

DESCRIPTION OF THE RELATED ART

FIG. 14 shows a proposed atomic force microscope. This atomic microscope is discussed in Japanese Patent Application No. Hei-5-26841 filed in Japan on Jul. 22, 1993 and now corresponding to U.S. Pat. No. 5,469,733 and Japanese Patent Application No. Hei-5-259869 filed in Japan on Oct. 18, 1993 and now corresponding to U.S. Pat. No. 5,477,732. The laser beam emitted by semiconductor laser equipment 4 is focused on the top surface of a cantilever 1, and the beam reflected off the cantilever 1 is directed to a photodiode sensor 5. The photodiode sensor 5 detects changes taking place in the position of the laser beam reflected off the cantilever 5 and thus picks up a microscopic deflection in the cantilever 1 due to an atomic force that acts between a sample 3 to be measured and a probe needle 2 disposed at one end of the cantilever 1.

The operation of the atomic force microscope for measuring the surface roughness image of the sample 3 is now discussed. A controller 7 applies a voltage to a Z electrode of a piezoelectric tube element 6 so that the laser light reflected off the cantilever 1 is directed to a fixed location of the photodiode sensor 5. The sample 3 to be measured is moved in the Z direction (vertical direction) to perform feedback control. A computer 8 allows the controller 7 to apply voltages to XY electrodes of the piezoelectric tube element 6 while feedback controlling the piezoelectric tube element 6 in the Z direction. The sample 3 to be measured is thus scanned in both X and Y directions. The surface roughness image of the sample is obtained by allowing the computer 8 to monitor the voltage for each of the X, Y, and Z directions the controller 7 applies to the piezoelectric tube element 6.

According to recent published research, Jpn. J. Appl. Phys. Vol. 32(1993) pp. 290–293, such an atomic force microscope has been modified and applied in the study of the dielectric breakdown voltage of a dielectric layer formed on top of a sample. FIG. 15 is a block diagram showing the published AFM/STM system, a combination of an Atomic Force Microscope and a Scanning Tunneling Microscope, for the measurement of the dielectric breakdown voltage of the dielectric layer of the sample surface.

In the AFM/STM system in FIG. 15, the method for measuring the surface roughness image (AFM image) of the sample 3 remains essentially the same as that shown FIG. 14. In the AFM/STM system in FIG. 15, however, a microscopic deflection that takes place in the cantilever 1 due to an atomic force acting between the probe needle 2 disposed at the end of the cantilever 1 and the sample 3 to be measured is detected via an optical fiber by the photodiode sensor 5 that uses interferometry. The surface roughness image (AFM image) of the sample 3 to be measured is obtained by picking up the AFM image signal at an output terminal T4.

An oxide layer 3a as thick as approximately 100 nm is formed on the top surface of the sample 3 in the measurement of the breakdown voltage of the dielectric layer of the sample surface. The breakdown of the oxide layer is observed. A constant-voltage power supply 79 is connected to the cantilever 1. An output terminal T3 is connected to the sample 3 to be measured, via a preamplifier 22, and an STM image signal is picked up at the output terminal T3.

The constant-voltage power supply 79 applies its regulated voltage to the probe needle 2 of the cantilever 1. A microscopic current flowing through the oxide layer 3a between the probe needle 2 and the sample 3 is monitored at the output terminal T3 through the preamplifier 22. The probe needle 2 disposed at the end of the cantilever 1 is ion-implanted for conductivity.

The proposed thin film analyzing apparatus thus constructed measures current distribution of the dielectric layer with respect to a constant voltage only, and thus fails to permit the measurement of general current-voltage characteristics (I/V characteristics). When the dielectric breakdown voltage of the sample is not known, there is a possibility that the application of a predetermined voltage of the apparatus to the probe needle may cause a current in excess of the required level to flow through the oxide layer between the probe needle and the sample. That could damage not only the dielectric layer but also the probe needle and the sample substrate. Therefore, the proposed thin film property analyzing apparatus cannot measure I/V characteristics, and may damage the sample.

SUMMARY OF THE INVENTION

In view of the above disadvantages, it is an object of the present invention to provide a thin film analyzing method and apparatus, which permit the measurement of the I/V characteristics of a thin film (not limited to a dielectric layer) of a sample and do not damage the sample to be measured.

It is another object of the present invention to provide semiconductor manufacturing equipment based on the thin film analyzing method.

To achieve the above objects, the present invention in its first aspect provides a thin film analyzing apparatus that comprises measuring means for measuring I/V characteristics at a plurality of test points on a thin film on a sample and image forming means for forming a surface current distribution image based on the I/V characteristic data the measuring means provides.

In its second aspect, the present invention provides a thin film analyzing apparatus wherein said measuring means measures surface roughness at the plurality of test points, and said image forming means forms a surface roughness image based on the surface roughness data the measuring means provides and forms the surface current distribution image based on the I/V characteristic data in accordance with the surface roughness image.

In its third aspect, the present invention provides a thin film analyzing apparatus wherein said measuring means includes an atomic force microscope having a cantilever with a probe needle on one end, a feedback loop for keeping the probe needle of the cantilever and the thin film a constant separation apart, and feedback switching means for opening the feedback loop during measurement of the I/V characteristic.

In its fourth aspect, the present invention provides a thin film analyzing apparatus that further comprises over-current preventing means for preventing an over-current from flowing through the thin film between the probe needle and the sample during measurement of the I/V characteristics.

In its fifth aspect, the present invention provides a thin film analyzing apparatus including a conductive coating on the cantilever and its probe needle of an electrically conductive material having a high melting point.

In its sixth aspect, the present invention provides a thin film analyzing method that comprises the steps of measuring I/V characteristics at each of a plurality of test points on the thin film of a sample surface using an atomic force microscope having a cantilever with a probe needle on one end and forming a surface current distribution image based on I/V characteristic data.

In its seventh aspect, the present invention provides a method of semiconductor structure manufacturing that comprises the inspection steps of measuring I/V characteristics at each of a plurality of test points n a thin film on a sample surface using an atomic force microscope having a cantilever with a probe needle on one end and forming a surface current distribution image based on I/V characteristic data.

According to the first aspect of the present invention, I/V characteristic data are obtained at each of the plurality of test points on the thin film of the sample surface, and the surface current distribution image is formed based on the I/V characteristic data. This arrangement allows one to understand accurately I/V characteristics for all the test points on the thin film.

According to the second aspect of the present invention, the measuring means measures surface roughness at the plurality of test points, and the image forming means forms the surface roughness image based on the surface roughness data the measuring means provides and forms the surface current distribution image based on the I/V characteristic data in accordance with the surface roughness image. The surface roughness image is thus correlated with the surface current distribution image.

According to the third aspect of the present invention, the measuring means includes an atomic force microscope having a cantilever with a probe needle on its one end, and the atomic force microscope comprises a feedback loop for keeping the probe needle of the cantilever and the thin film a constant separation apart. Further provided is feedback switching means for opening the feedback loop during measurement of the I/V characteristic. This arrangement excludes the influence of a surge of current that flows during measurement of the I/V characteristics and thus helps stabilize the operation of the apparatus.

According to the fourth aspect of the present invention, further provided is over-current preventing means for preventing an over-current from flowing through the thin film between the probe needle and the sample during measurement of the I/V characteristics. The analyzing apparatus is thus prevented from being damaged by over-currents.

According to the fifth aspect of the present invention, the electrically conductive coating on the cantilever and its probe needle is constructed of an electrically conductive material having a high melting point. The cantilever and the probe needle are thus prevented from melting due overcurrents.

According to the sixth aspect of the present invention, I/V characteristics at each of the plurality of test points on the thin film of the sample surface are measured using an atomic force microscope having a cantilever with the probe needle on one end and the surface current distribution image is formed based on I/V characteristic data. This method allows one to understand accurately I/V characteristics for all the test points on the thin film.

According to the seventh aspect of the present invention, in the method of semiconductor manufacturing, I/V characteristics at each of the plurality of test points on the dielectric layer are measured using the atomic force microscope having the cantilever with the probe needle on one end and the surface current distribution image is formed based on I/V characteristic data. This method allows one to understand accurately the dielectric characteristic of the dielectric layer.

BRIEF DESCRIPTION OF THE DRAWINGS

FIGS. 11A to 11E are explanatory cross-sectional views showing a series of processes of a method by semiconductor manufacturing according to Embodiment 5.

DETAILED DESCRIPTION OF THE PREFERRED EMBODIMENTS

Figure 1:
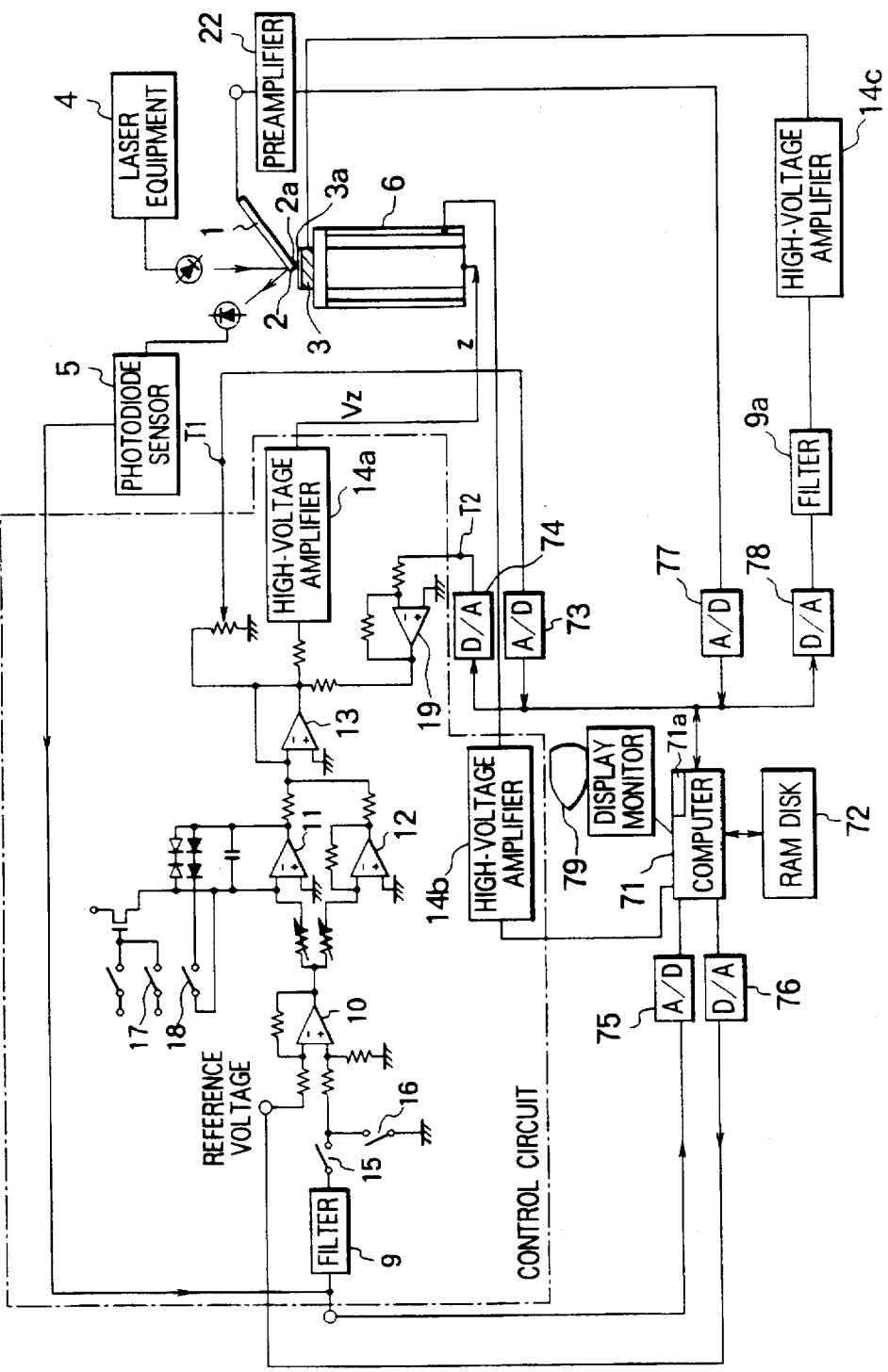
FIG. 1 is a schematic diagram showing Embodiment 1 of a thin film property analyzing apparatus according to the present invention.

Referring now to the drawings, the embodiments of the present invention are discussed.

EMBODIMENT 1

FIG. 1 is the schematic diagram showing the thin film analyzing apparatus for measuring I/V characteristics according to the present intention. A cantilever 1 is disposed below a semiconductor laser instrument 4. A piezoelectric tube element 6 is disposed below the cantilever 1. Disposed above the cantilever 1 is a photodiode sensor 5 which is connected to a control circuit 70 that controls the piezoelectric tube element 6 as a means for moving, i.e., scanning in the X, Y, and Z directions. A preamplifier 22 is connected to the cantilever 1, and the output of the preamplifier 22 is coupled to a computer 71 via an A/D converter 77. The substrate of a sample 3 bears an oxide layer 3a as its top surface film. The substrate of the sample 3 is connected to the computer 71 via a high-voltage amplifier 14c, a filter 9a and a D/A converter 78. These components are included in the measuring means.

The control circuit 70 is connected to the computer 71 via A/D converters 73, 75, and D/A converters 74, 76. The computer 71 operates under the control of a stored program 71a. Also connected to the computer 71 are a RAM disk 72 and a display monitor 79. The computer 71 forms the image forming means of the present invention.

The control circuit 70 contains a filter 9 coupled to the output of the photodiode sensor 5. The filter 9 is connected via switches 15, 16 to a differential amplifier 10 which, in turn, is connected to an integrating amplifier 11 and a proportional amplifier 12 which are connected in parallel. The outputs of the integrating amplifier 11 and the proportional amplifier 12 are coupled to an adder 13. The output of the adder 13 is coupled to an AFM (Atomic Force Microscope) image signal output terminal T1 and to the Z electrode of the piezoelectric tube element 6 via a high-voltage amplifier 14a. The input terminal of the high-voltage amplifier 14a is connected to an input terminal T2 to which the computer 71 feeds a Z driving voltage via the D/A converter 74. Designated 19 is an amplifier for fine adjustment of the Z driving voltage. The control circuit 70 further comprises a high-voltage amplifier 14b that applies XY scanning voltages to the XY electrodes of the piezoelectric tube element 6 under the control of the computer 71. Designated 17 and 18 are switches for focus curve measurement. Their explanation is omitted, because they are not important in the context of the present invention.

The operation of switches 15 through 18 is controlled by the computer 71 (their control lines are not shown in the figure). Designated 2a is an electrically conductive coating that covers a probe needle 2 and the cantilever 1. This will be discussed later in connection with Embodiment 3.

The operation of the above arrangement is now discussed. The measurement of data for the surface roughness image in the thin film analyzing apparatus remains essentially the same as that for the above-described proposed atomic force microscope. In FIG. 1, at the moment the switch 15 in the control circuit 70 is turned on, the switch 16 is turned off. Laser light emitted from the semiconductor laser instrument 4 is directed to the top surface of the cantilever 1. Laser light reflected off the surface of the cantilever 1 is then introduced into the photodiode sensor 5. The photodiode sensor 5 detects changes taking place in the position of the laser light reflected off the cantilever 1 and thus picks up a microscopic deflection in the cantilever 1 due to an atomic force that acts between the sample 3 to be measured and the probe needle 2 disposed at one end of the cantilever 1.

The output signal of the photodiode sensor 5 is sent to the differential amplifier 10 via the filter 9 in the control circuit 70. The differential amplifier 10 compares the output signal from the photodiode sensor 5 with the reference voltage that is applied by the computer 71 via the D/A converter 76. The output of the differential amplifier 10 is amplified by each of the integrating amplifier 11 and the proportional amplifier 12. The outputs of the integrating amplifier 11 and the proportional amplifier 12 are added by the adder 13. The added output, after being increased in voltage by the high-voltage amplifier 14a, is applied to the Z electrode of the piezoelectric tube element 6. These components are part of the feedback loop.

The position of the sample 3 in the Z axis is feedback controlled so that the output level of the photodiode sensor 5 remains constant. The surface image (AFM image) signal appearing at the output terminal T1 connected to the output of the adder 13 is sent to the computer 71 via the A/D converter 73.

The measurement procedure for the I/V characteristics is now discussed. By "the I/V characteristics" is meant the I/V characteristics of the thin film constituting the top surface layer of the sample. The feedback loop is closed by turning the switch 15 on and turning the switch 16 off. With the feedback loop kept closed, through the D/A converter 78 and the filter 9a, the computer 71 controls the high-voltage amplifier 14c to supply a desired triangular pulse voltage within a range of 0 V to ±220 V to the sample 3 to be measured the D/A converter 78, the filter 9a, part of the computer 71, and the high voltage amplifier 14c comprising means for applying a voltage that increases with time to a maximum voltage. Given the applied voltage, a microscopic current flows through the oxide layer 3a between the probe needle 2 and the sample 3. The microscopic current is amplified by the preamplifier 22, and then sent to the computer 71 via the A/D converter 77. The computer 71 thus receives the I/V characteristic data at a given test point on the oxide layer 3a. Since the D/A converter 78 converts the digital signal from the computer 71, the output signal of the D/A converter 78 still contains some slight stepwise changing components. The filter 9a is used to smooth these components.

Figure 2A:
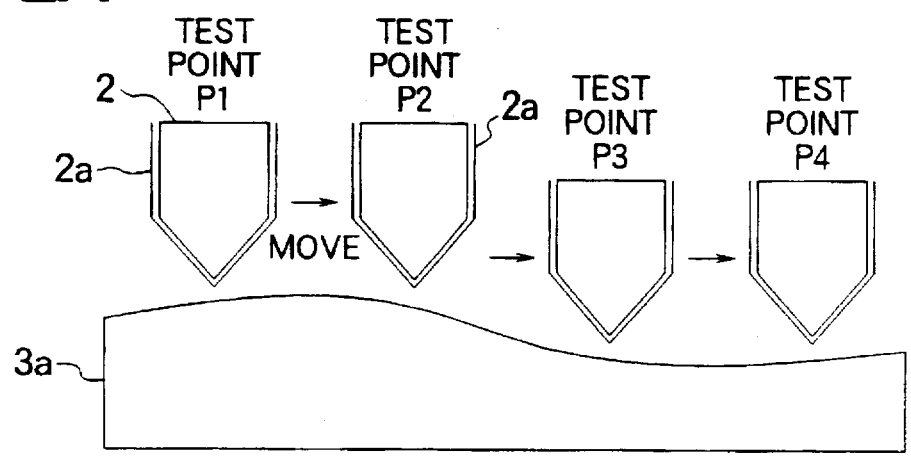
FIGS. 2A and 2B are timing diagrams showing the operation of Embodiment 1.
Figure 2B:
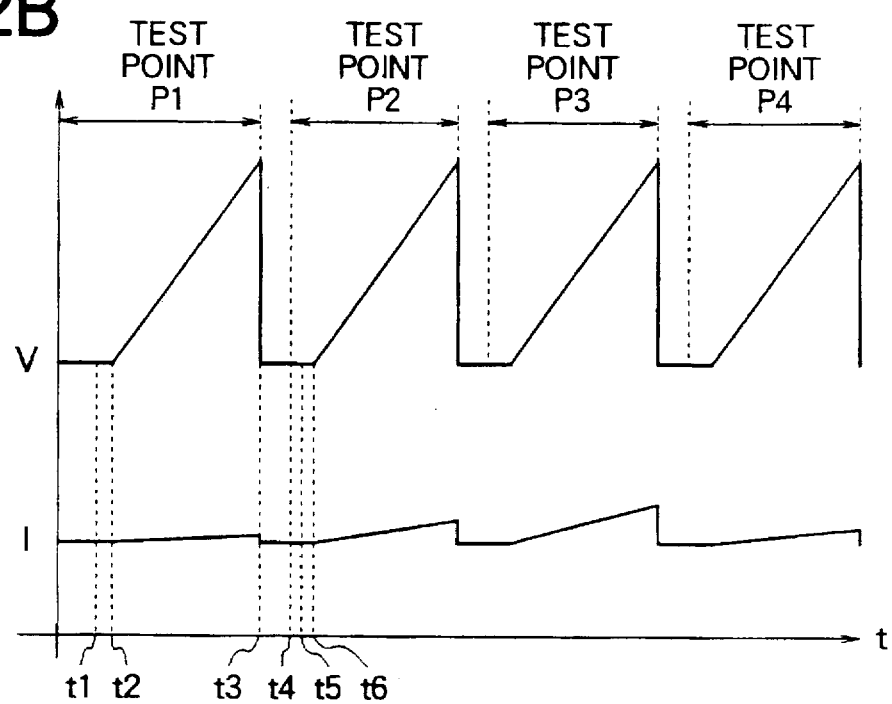

The thin film analyzing apparatus according to the present invention performs measurements of surface roughness and I/V characteristics at all of a plurality of test points on the surface of the sample 3. FIGS. 2A and 2B illustrate the timing of surface roughness measurements and I/V characteristics measurements. FIG. 2A illustrates the probe needle that travels on the oxide layer as the top surface layer of the sample. FIG. 2B is the timing diagram showing the relationship between applied voltage V at time t at each test point and microscopic current I that flows then. In FIG. 2B, the ordinate represents voltage V applied to the sample to be measured and microscopic current that flows through the oxide layer between the probe needle and the sample. The abscissa represents time t.

With the feedback loop kept closed and the atomic force acting between the probe needle 2 of the cantilever 1 and the sample 3 kept constant, the sample 3 being measured is moved in the XY directions so that a first test point P1 on the sample surface (the oxide layer 3a, for example) comes below the probe needle 2. Measurements of surface roughness are made at time t1, and measured data are then stored in the RAM disk 72. Then, at time t2, a triangular pulse voltage, for example, as high as 20 V (as shown in FIG. 2B) or a saw-tooth wave voltage consisting of a plurality of triangular pulses is applied to the sample 3 in order to measure I/V characteristics (for example, current is measured at 100 voltage levels ranging from 0 V to a desired voltage). When the measurements of I/V characteristics are complete at time t3, the measured I/V characteristic data are stored in the RAM disk 72. During the interval between time t3 and time t4, the computer 71 moves the sample 3 being measured until a second test point P2 of the sample surface comes below the probe needle 2. In succession, the computer 71 measures surface roughness at the second test point P2 at time t5, and I/V characteristics at time t6.

Likewise, the above sequence is repeated on all the test points, for example, 64×64 or 128×128 test points, on an observed area of the surface of the sample 3. The computer 71 forms a surface roughness image of the observed area based on the surface roughness data obtained at each test point while forming a surface current distribution image based on the I/V characteristics data obtained at each test point. The surface roughness image and the surface current distribution image may be presented on any appropriate display monitor 79. Since both the surface roughness image and the surface current distribution image are based on data, each set of which has been taken at the same test point at substantially the same moment, comparison between both images allows one to gain a more accurate understanding of the surface state of the sample 3.

Figure 3A:
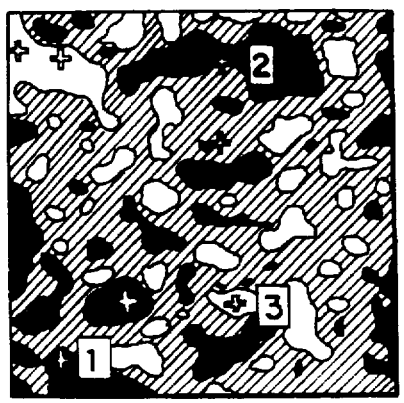
FIG. 3A shows the surface roughness image of a TiN layer obtained from Embodiment 1.
Figure 3B:
FIG. 3B is the surface current distribution image corresponding to FIG. 3A.
Figure 3C:
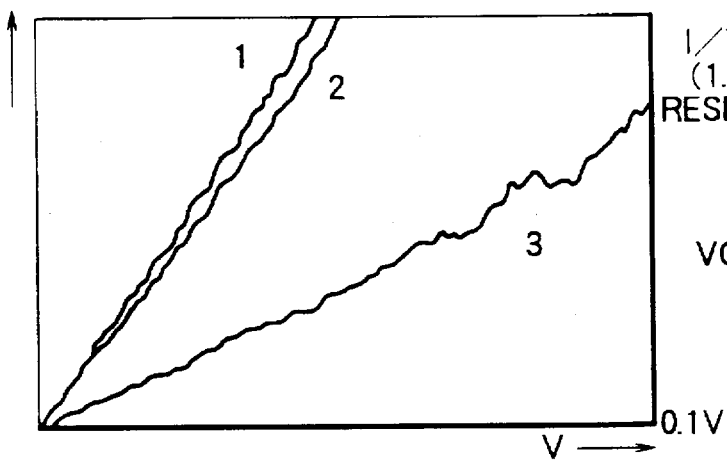
FIG. 3C shows the I/V characteristics corresponding to FIG. 3A.

FIGS. 3A to 3C show the results of measurements conducted on TiN film (not a dielectric layer) according to this embodiment. FIG. 3A shows a surface roughness image (AFM image), wherein brighter portions represent higher projecting areas. FIG. 3B shows a surface current distribution image (CITS) (with bias voltage being +0.05 V), wherein bright portions represent high-current areas. FIG. 3C shows I/V characteristics at each of points 1, 2 and 3 marked by a plus sign (+) in FIG. 3A. The TiN layer has a thickness of 65 nm, and was formed by sputtering. A number of particulate projections (as high as approximately 7 nm) were observed. An observed area was 248 nm×248 nm, the voltage V applied to the sample during measurement of I/V characteristics was +0.1 V and the number of test points was 64×64 points. By correlating the surface roughness image, the surface current distribution image and I/V characteristic data, the TiN layer was found to be electrically conductive, and currents at boundaries, namely, at inter-particle areas were dominant.

Figure 4A:
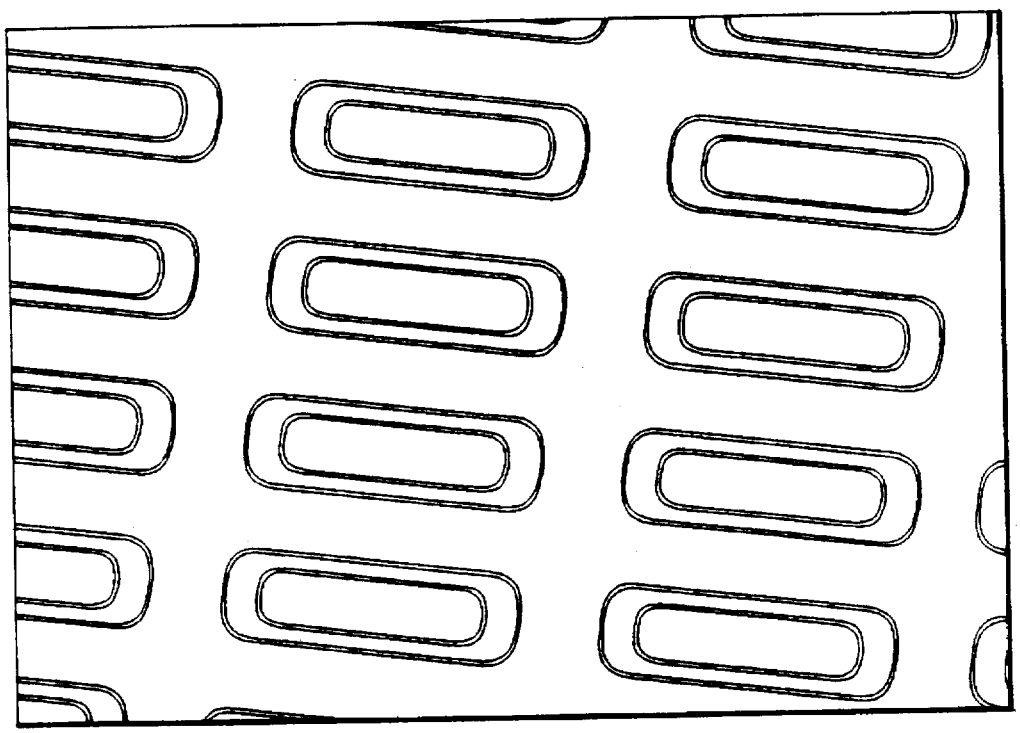
FIG. 4A shows a test pattern Embodiment 1 uses in the evaluation of dielectric breakdown.
Figure 4B:
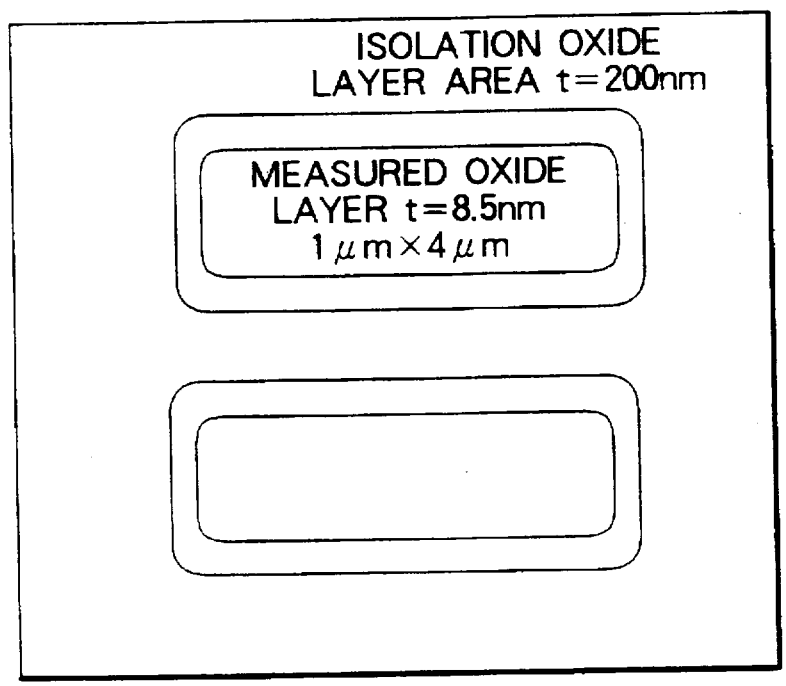
FIG. 4B is an enlarged view of a part of FIG. 4A.
Figure 5A:
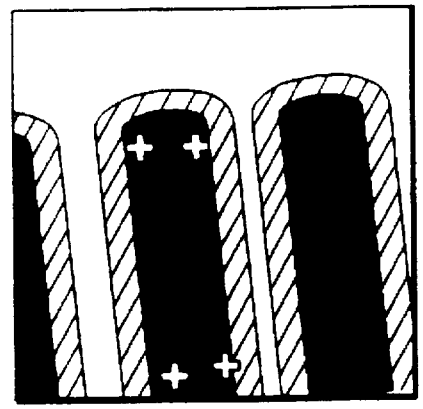
FIG. 5A shows a surface roughness image of the test pattern given by Embodiment 1 as a result of dielectric breakdown evaluation.
Figure 5B:
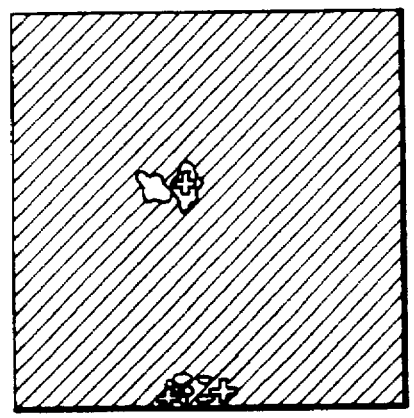
FIG. 5B shows a surface current distribution image corresponding to the surface roughness image of FIG. 5A.

The method of Embodiment 1 is also applied to the evaluation of dielectric breakdown of a thin oxide layer. FIG. 4A shows the test pattern of Embodiment 1 used in the evaluation of dielectric breakdown. FIG. 4B is an enlarged view of a part of FIG. 4A. This test pattern is constructed of thinner oxide layer areas, each being 8.5 nm thick and 1 μm×4 μm wide, formed on top of an isolation oxide layer 200 nm thick. FIG. 5A shows a surface roughness image of the thin oxide layer areas given by Embodiment 1. FIG. 5B shows a surface current distribution image corresponding to the surface roughness image of FIG. 5A. The observed area in this case was then 3465 nm×3465 nm, the voltage V applied to the sample during measurements of I/V characteristics was +29 V and the number of test points was 64×64 points. Points marked by a plus sign (+) represent local dielectric breakdown points of the thin oxide layer areas where current I of the sample flows well.

Figure 6A:
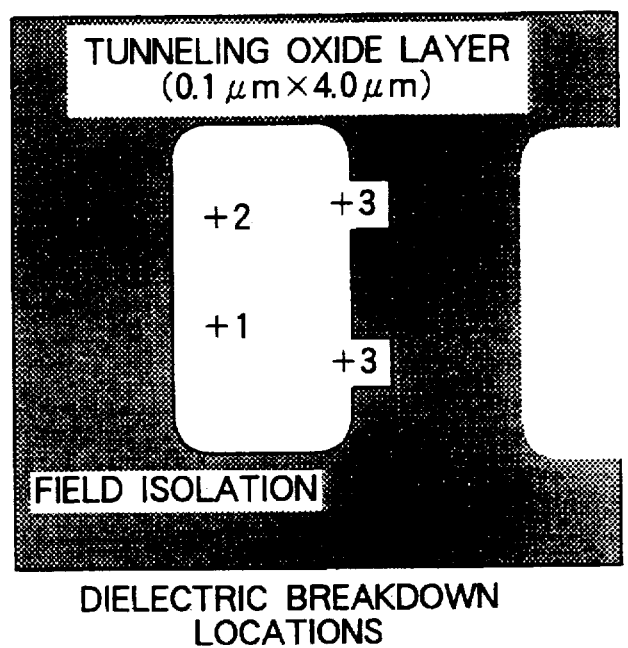
FIG. 6A shows a dielectric breakdown location of the test pattern given by Embodiment 1 as a result of dielectric breakdown evaluation.
Figure 6B:
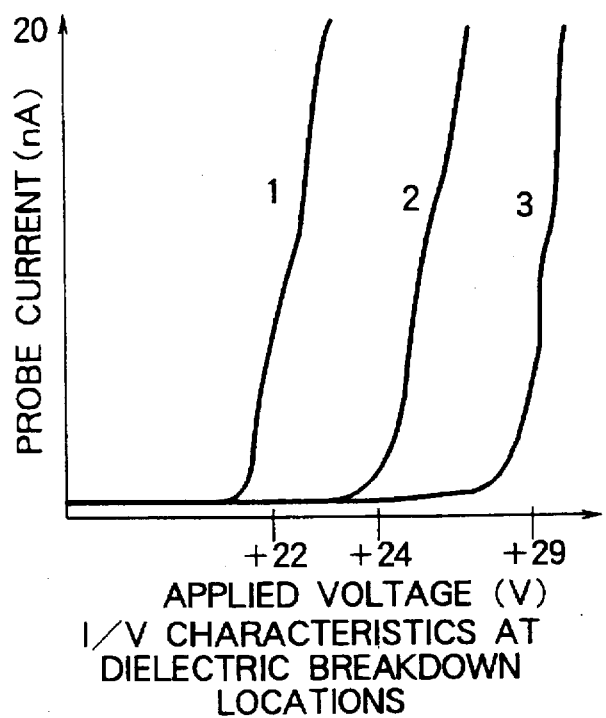
FIG. 6B shows I/V characteristics corresponding to FIG. 6A.

FIGS. 6A and 6B diagrammatically show the test results of FIGS. 5A and 5B. FIG. 6A diagrammatically shows dielectric breakdown locations. FIG. 6B shows the I/V characteristics corresponding the dielectric breakdown points in FIG. 6A. As the voltage applied to the sample 3 was raised to 22 V, to +24 V, and then to +29 V, dielectric breakdown took place at +1, +2 and +3 points on the thin oxide layer. The method and apparatus of Embodiment 1 was thus used to evaluate dielectric breakdown of the thin oxide layer.

In the thin film analyzing apparatus in Embodiment 1, measurements are made with current flowing from the sample 3 to the probe needle 2. Thus, measurements are less influenced by the substrate of the sample 3 and offer accurate I/V characteristic data, compared to measurements with current flowing from the probe needle 2 to the sample.

EMBODIMENT 2

In Embodiment 1, measurements of I/V characteristics are made by applying a triangular pulse wave or saw-tooth pulse wave, as high as 20 V or so, to the sample 3 being measured at time t2 (FIG. 2B) with the feedback loop kept closed. When the dielectric breakdown of a thin oxide layer is evaluated, a large current may momentarily flow through a dielectric breakdown point of the oxide layer 3a between the probe needle 2 and the sample 3. In such a case, the shock due to this current repulses the probe needle 2. When the feedback loop remains closed, it is unable to accommodate such a instantaneous change. This may lead to a failure of the control circuit 70. A stable operation of the apparatus will be expected if the feedback loop is opened only when the measurements of the I/V characteristics are made.

Figure 7A:
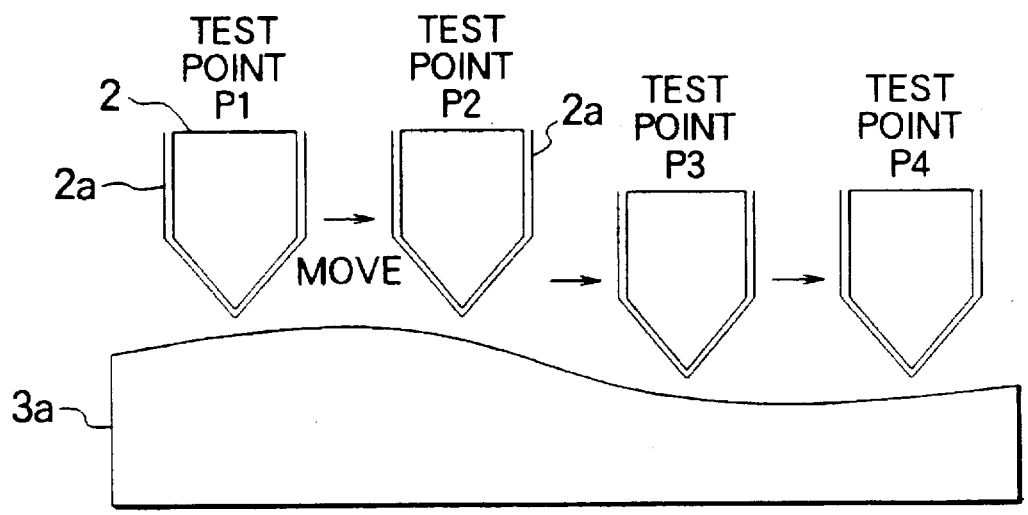
FIGS. 7A and 7B are timing diagrams showing operation of an Embodiment 2 of the present invention.
Figure 7B:
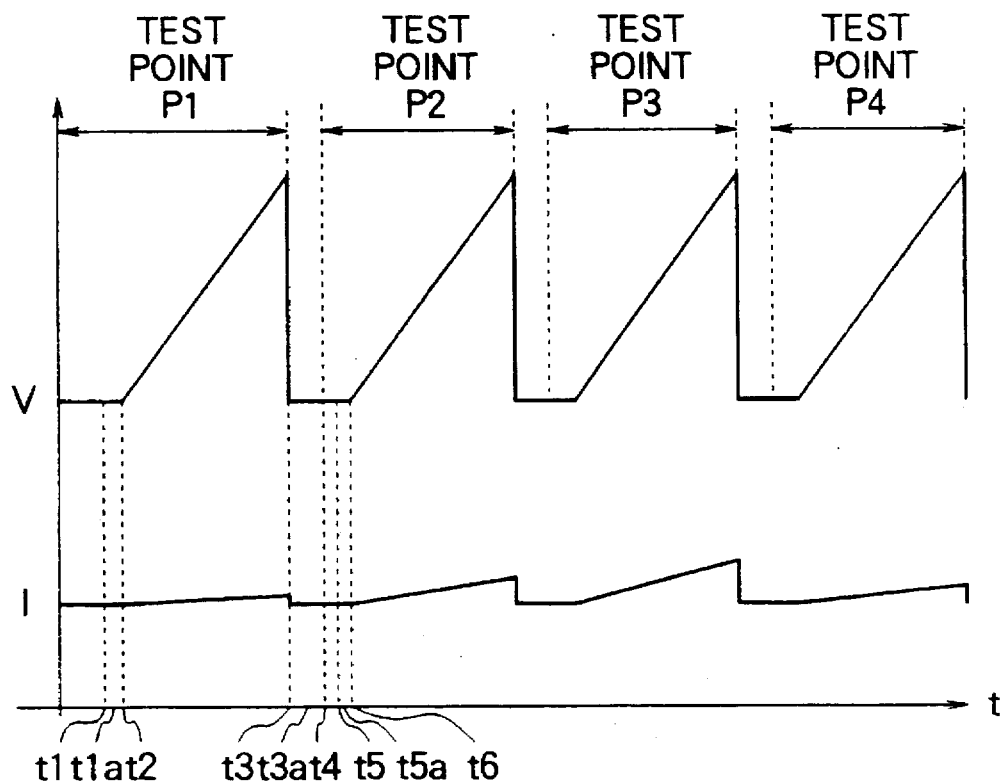

FIGS. 7A and 7B show the timing diagram of measurements of Embodiment 2 wherein the feedback loop is opened during measurements of I/V characteristics. FIG. 7A shows the probe needle that is traveling for measurements. FIG. 7B is the timing diagram showing applied voltage V at time t at each test point and microscopic current I that flows at the corresponding test point. The apparatus in this embodiment remains essentially unchanged from the one shown in FIG. 1. The feedback loop switching means includes switches 15, 16 and the computer 71 that controls both switches. A modification is thus incorporated in the content of the program 71a contained in the computer 71 related to the operation of switches 15, 16.

With the feedback loop kept closed and with the atomic force acting between the probe needle 2 disposed at the end of the cantilever 1 and the sample 3 kept constant, the first test point P1 of the surface of the sample 3 moves below the probe needle 2. Surface roughness data are obtained at time t1, and then stored in the RAM disk 72. At time t1a, the feedback loop is opened. To open the feedback loop, switch 15 is opened, and switch 16 is closed so that the differential amplifier 10 gives a zero volt output. With the feedback loop kept open, a triangular pulse wave or a saw-tooth pulse wave, as high as 20 V or so, is applied to the sample 3 at t2 to measure I/V characteristics (for example, current is measured at 100 voltage levels ranging from 0 V to a desired voltage).

When measurements of I/V characteristics are complete at time t3, the I/V characteristic data are stored in the RAM disk 72 as well.

The feedback loop is closed at time t3a. By time t4, the computer 71 moves the sample 3 in XY directions so that the second test point P2 on the surface of the sample 3 comes below the probe needle 2. At time t5, the computer 71 measures surface roughness at the second test point P2. At time t5a, the feedback loop is opened, and then I/V characteristics are measured at time t6.

Likewise, the above sequence is repeated on all the test points, for example, 64×64 or 128×128 test points, set up on an observed area of the surface of the sample 3. The computer 71 forms a surface roughness image of the observed area based on the surface roughness data obtained at each test point while forming a surface current distribution image based on the I/V characteristics data obtained at each test point. The surface roughness image and the surface current distribution image may be presented on any appropriate display monitor 79.

By opening the feedback loop during measurements of I/V characteristics only, the thin film analyzing apparatus is free from the possibility of damage in the control circuit and its operation is stabilized.

EMBODIMENT 3

In Embodiment 1, measurements of I/V characteristics are made by applying a triangular pulse wave or saw-tooth pulse wave, as high as 20 V or so, to the sample 3 being measured at time t2. When the dielectric breakdown of a thin oxide layer is evaluated, the dielectric breakdown characteristic differs from test point to test point. Furthermore, at a dielectric breakdown point, a large current can flow momentarily through the oxide layer 3a between the probe needle 2 and the sample 3. Such a surge current damages the electrically conductive coating 2a covering the probe needle 2 and the cantilever 1.

To cope with this disadvantage, a limitation is imposed on the current that flows between the probe needle 2 and the sample 3, and a current larger than a threshold current is prevented from flowing between the probe needle 2 and the sample 3. The electrically conductive coating 2a that covers the probe needle 2 and the cantilever 1 is protected against damage.

Figure 8A:
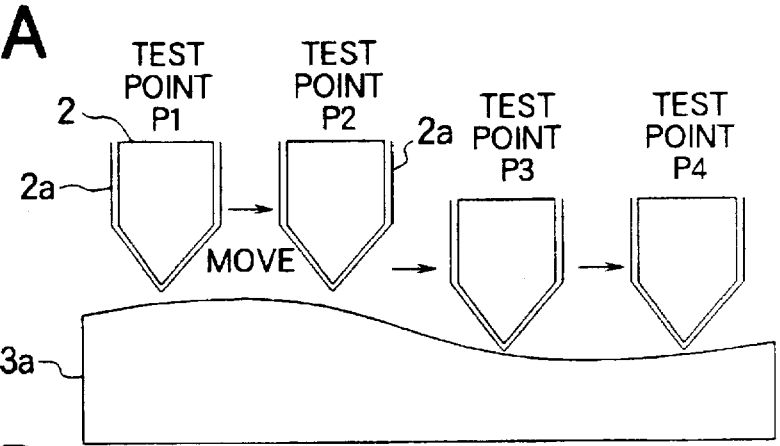
FIGS. 8A to 8B are timing diagrams showing operation of Embodiment 3 of the present invention.
Figure 8B:
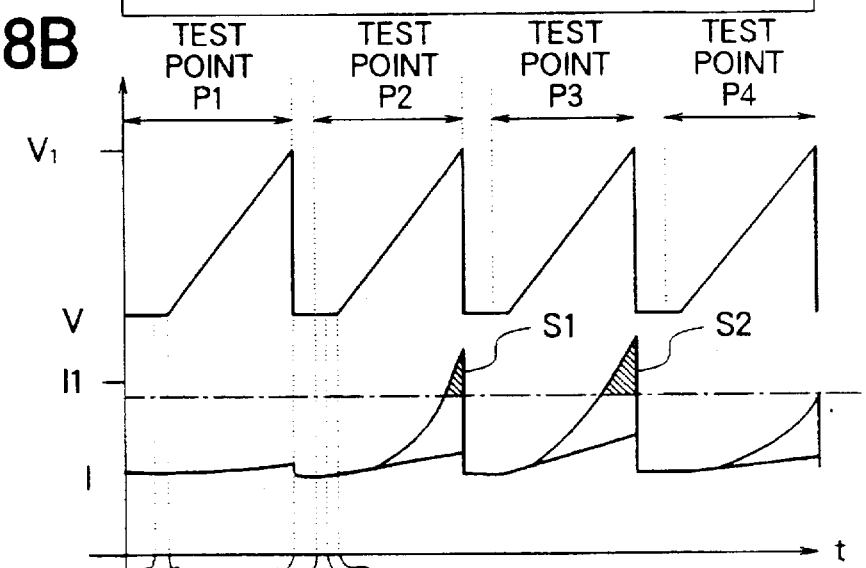
Figure 8C:
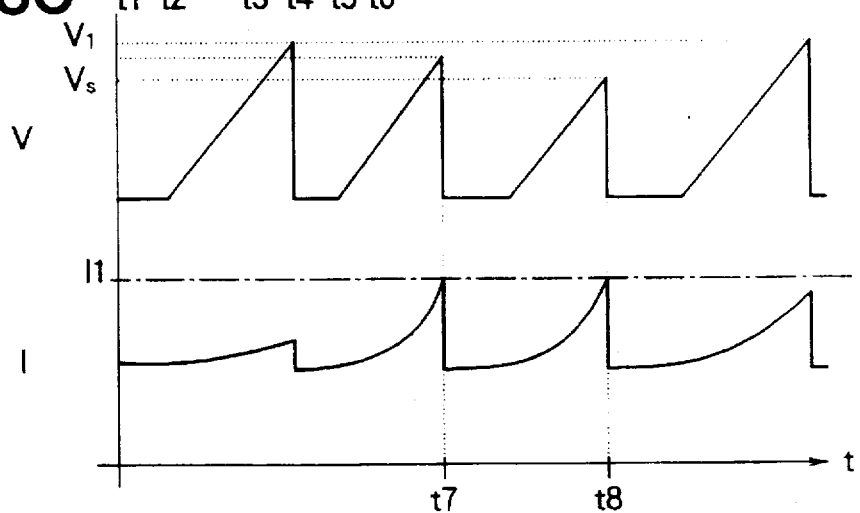

FIGS. 8A to 8C are timing diagrams showing the operation of Embodiment 3 including an over-current prevention operation. FIG. 8A shows the probe needle 2 that is moving for measurements. FIG. 8B is the timing diagram showing the relationship of applied voltage V at time t at each test point and microscopic current I that flows then, without over-current prevention operation. FIG. 8C is the timing diagram showing the relationship of applied voltage V at time t at each test point and microscopic current I that flows in an over-current prevention operation.

The over-current prevention operation is under the control of the program 71a in the computer 71 in FIG. 1. The computer 71 receives a signal from the preamplifier 22, compares it with a predetermined value, and returns the voltage applied to the sample to zero when the signal from the preamplifier 22 exceeds the predetermined value. Part of the computer 71 and the preamplifier 22 comprise a means for switching the voltage applied to the sample to zero when a current larger than a threshold current flows between the probe needle and the sample 3. The program 71a thus contains an additional program for this operation. The computer 71 thus is part of the over-current preventing means.

When the over-current preventing operation is inactive, a pulse wave having its peak at a fixed voltage V1 is applied to every test point on the sample 3 as shown in FIG. 8B. At test points P2 and P3, excess currents S1, S2, in excess of a current threshold I1, flow. When the current threshold I1 is set as a current limit as shown in FIG. 8C, the voltage applied to the sample 3 is returned to zero volts when the current reaches the current threshold I1 at times t7 and t8.

This method protects the electrically conductive coating 2a of the probe needle 2 and the cantilever 1 against any damage due to over-currents.

EMBODIMENT 4

In its application for I/V characteristic measurements, Embodiment 1 employs a typically available electrically conductive coating for the coating 2a that covers the probe needle 2 and the cantilever 1. When the dielectric breakdown of a thin oxide layer is evaluated, a large current can flow momentarily through the oxide layer 3a between the probe needle 2 and the sample 3. Such a surge current damages the electrically conductive coating 2a covering the probe needle 2 and the cantilever 1. The electrically conductive coating 2a preferably withstands excess currents and, in particular, is a high melting point material.

Figure 9A:
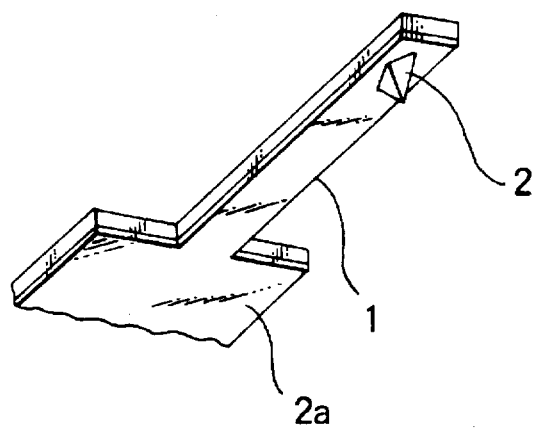
FIG. 9A is a perspective view of a cantilever showing Embodiment 4 of an the present invention.
Figure 9B:
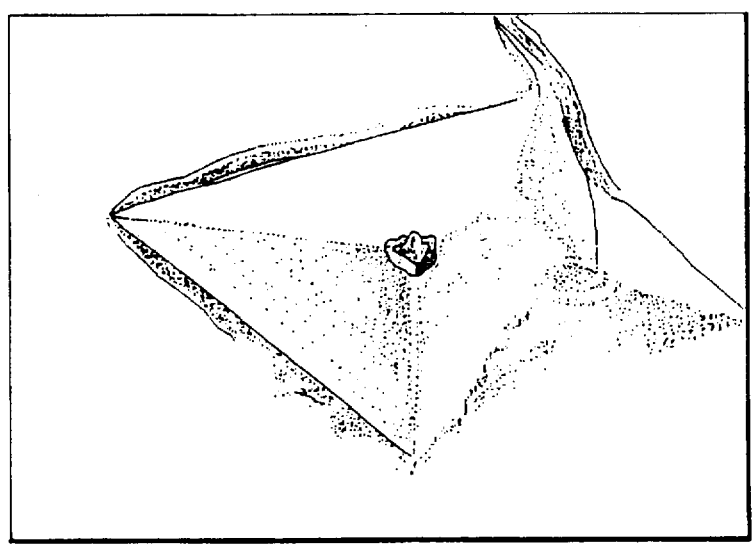
FIG. 9B shows the gold-coated tip of the probe needle of the cantilever.
Figure 9C:
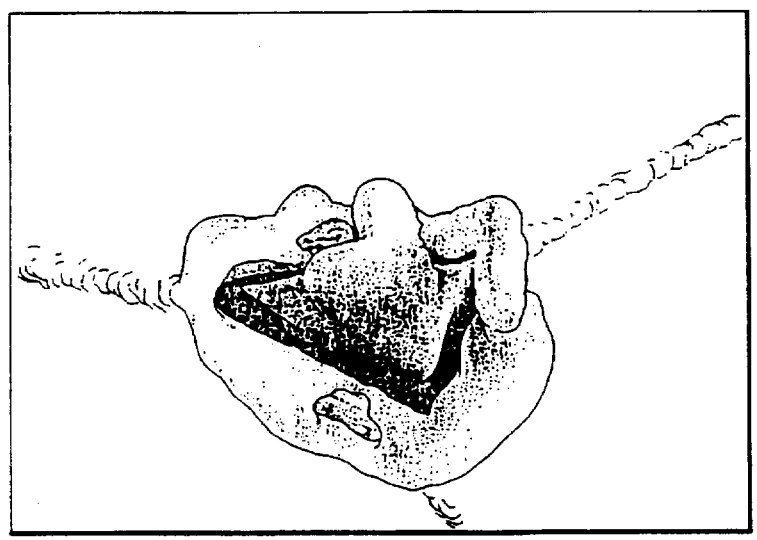
FIG. 9C is an enlarged view of the probe needle tip of FIG. 9B.

FIGS. 9A to 9C show the cantilever in detail. FIG. 9A is a perspective view showing the underside of the cantilever. FIG. 9B shows the melted state of the probe needle. FIG. 9C is an enlarged view of the melted probe needle. As shown in FIG. 9A, the cantilever 1 is a strip, for example, constructed of silicon, having on an end a probe needle having a triangular pyramid or square pyramid shape. The underside of the cantilever 1 including the probe needle 2 is coated with an electrically conductive layer 2a to allow current to flow. The electrically conductive coating layer 2a is formed by depositing gold or the like. Excess currents that flow during measurements can melt gold (the melting point of gold is 1063° C.). FIGS. 9B and 9C show such states. Gold was deposited on the cantilever for about 3 minutes using a vacuum metallizer (JEE-4X manufactured by Nippon Denshi) under the conditions of filament current of 20 A and vacuum level of 6×10$^{-4}$ Pa. Figures show the probe needle of the cantilever to which a voltage of +30 V was applied, and the tip of the probe needle is obviously melted.

In this embodiment, the electrically conductive coating 2a of the cantilever 1 is a high evaporation or melting point material. Specifically, platinum was used to form the electrically conductive coating 2a by sputtering. Using a magnetron sputtering instrument (JUC-5000), platinum was sputtered in two sessions, each of four minutes duration, under the conditions of a cathode voltage of 4.5 kV, an ion current of 10 mA, and a vacuum level of 5 Pa (in air) or less to form the electrically conductive layer 2a. Melting such as seen in FIG. 9C did not take place even if at least a voltage of +30 V was applied to the sample. Sputtering produces a thin structure of the electrically conductive coating 2a, compared to the vacuum-deposition technique, and thus, the tip of the probe needle 2 may be sharper. Therefore, a cantilever having an electrically conductive coating 2a is formed by sputtering is expected to provide a higher accuracy in measurements.

As a material for the electrically conductive layer 2a, is preferably platinum (melting point 1774° C.), chromium (melting point 905° C.), carbon, or the like are preferred.

EMBODIMENT 5

In Embodiments 1 through 4, a relatively small strip as a sample being measured is mounted on the piezoelectric tube element 6. Instead of the small strip, a semiconductor wafer may be mounted. In such a case, the thin film analyzing method according to the present invention may be used as an inline measuring method in a semiconductor manufacturing process.

Figure 10:
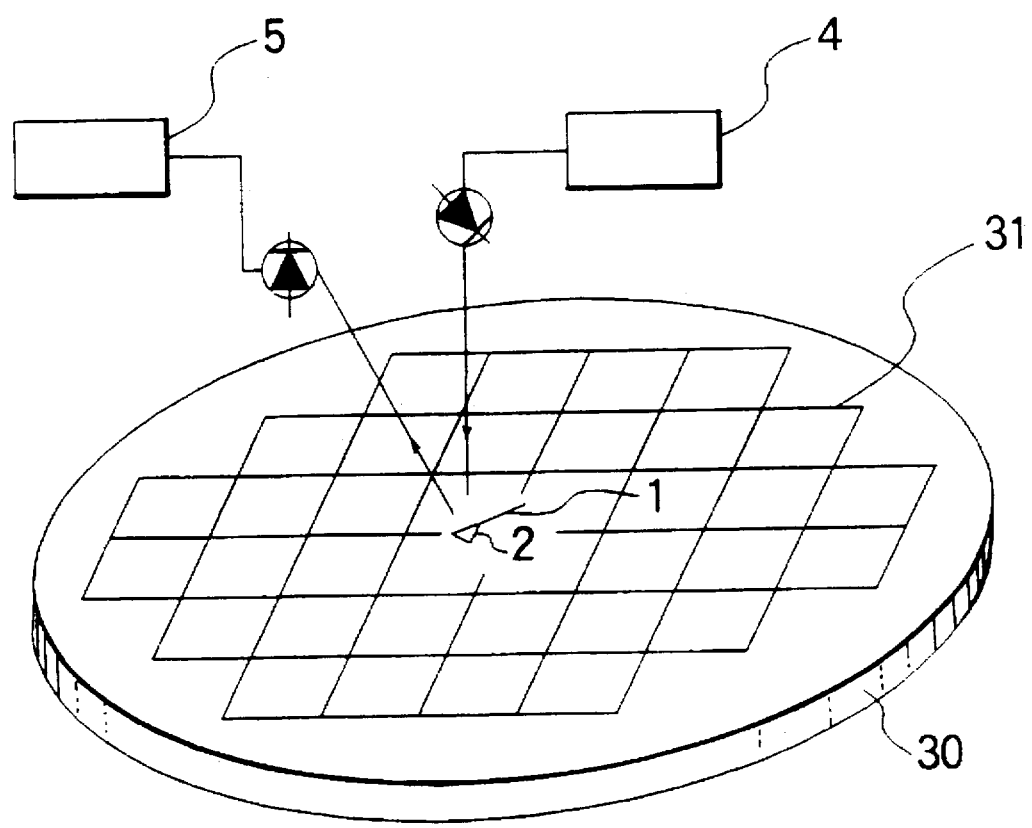
FIG. 10 is a perspective view showing an inspection method in Embodiment 5 of the present invention.

According to Embodiment 5 shown in FIG. 10, in a semiconductor manufacturing method, surface current distribution (including I/V characteristics as well) is measured on the surface of a semiconductor element 31 that has been patterned on the semiconductor wafer 30, and an inspection is made of whether dielectric strength above a required value is obtained. To measure current distribution, the semiconductor element 31 is moved below the probe needle 2 of the cantilever 1 of the thin film analyzing apparatus. The thin film analyzing apparatus projects a laser beam emitted from the semiconductor laser equipment 4 onto the top surface of the cantilever 1 in the same manner shown in FIG. 1, and the reflected laser beam is picked up by the photodiode 5.

The semiconductor element 31 is manufactured through a series of processes as shown in FIGS. 11A through 13B. An oxide layer 33 and a nitrided layer 34 are formed on top of the semiconductor wafer 30 (FIG. 11A). Patterning is performed (FIG. 11B). An isolation oxide layer 35 is formed (FIG. 11C). The oxide layer 33 and the nitride layer 34, which have functioned as a mask for forming the isolation oxide layer 35, are then removed (FIG. 11D) to form a gate oxide layer 36 for a transistor (FIG. 11E).

The surface of the gate oxide layer 36 is put closer to the probe needle 2 of the cantilever 1 of the thin film analyzing apparatus. The method discussed in connection of each of the embodiments 1 through 4 is used to measure surface current distribution (including I/V characteristics as well). When measurement results show that dielectric strength of the semiconductor wafer is higher than a predetermined value, it goes to a next step. When surface current distribution data do not satisfy dielectric strength requirements, the semiconductor wafer is judged to be defective, and thus rejected from a production line.

Figure 12A:
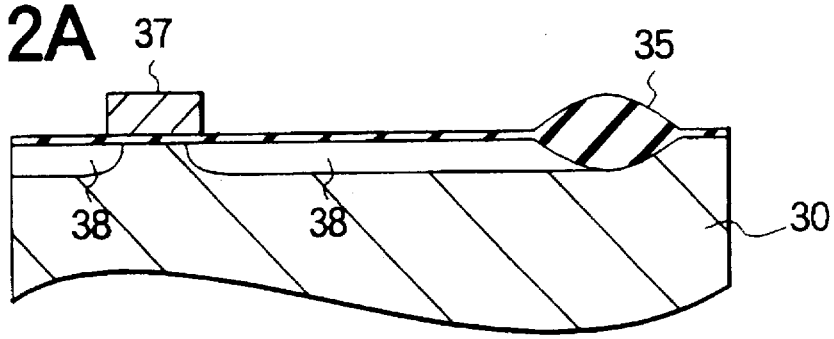
FIGS. 12A to 12D are explanatory cross-sectional views showing the series of processes in a method by semiconductor manufacturing according to Embodiment 5.
Figure 12B:
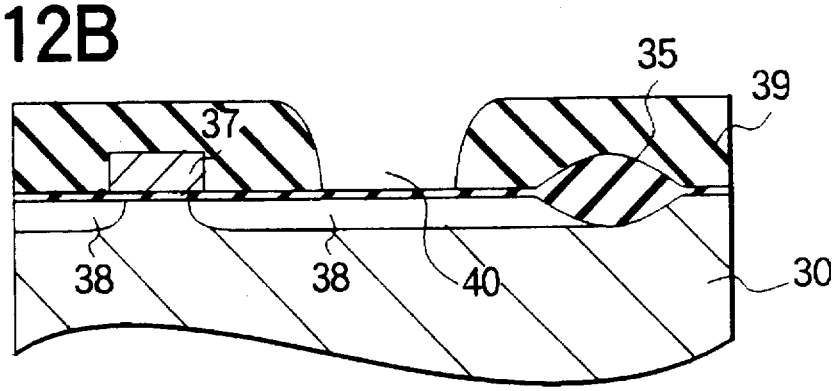
Figure 12C:
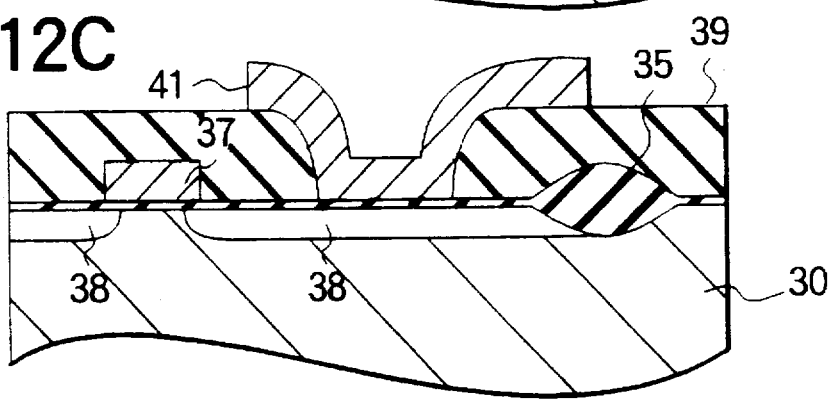

In a next step as in FIG. 12A, a gate electrode 37 of the transistor is formed, and a channel region 38 is formed by ion implantation or the like. An inter-layer film 39 is deposited, and a contact hole 40 (FIG. 12B) is formed. The lower electrode 41 of a capacitor is then formed (FIG. 12C). The lower electrode is oxidized to form a dielectric layer 42 for the capacitor (FIG. 12D).

Figure 12D:
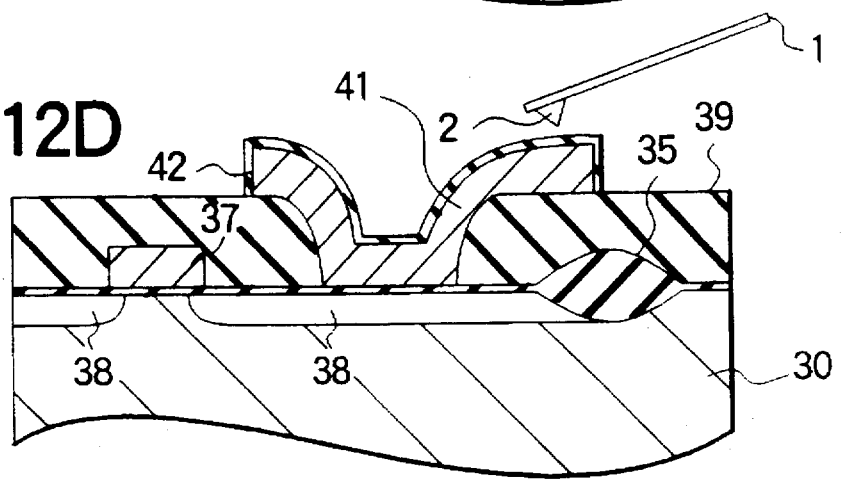

As shown in FIG. 12D, the surface of the dielectric layer 42 of the capacitor is put close to the probe needle 2 of the cantilever 1 of the thin film analyzing apparatus. The method discussed in connection of each of the embodiments 1 through 4 is used to measure surface current distribution. When measurement results show that dielectric strength of the semiconductor wafer is higher than a predetermined value, it goes to a next step. When surface current distribution data do not satisfy the dielectric strength requirements, the semiconductor wafer is judged to be defective at FIG. 12D, and thus rejected from a production line.

Figure 13A:
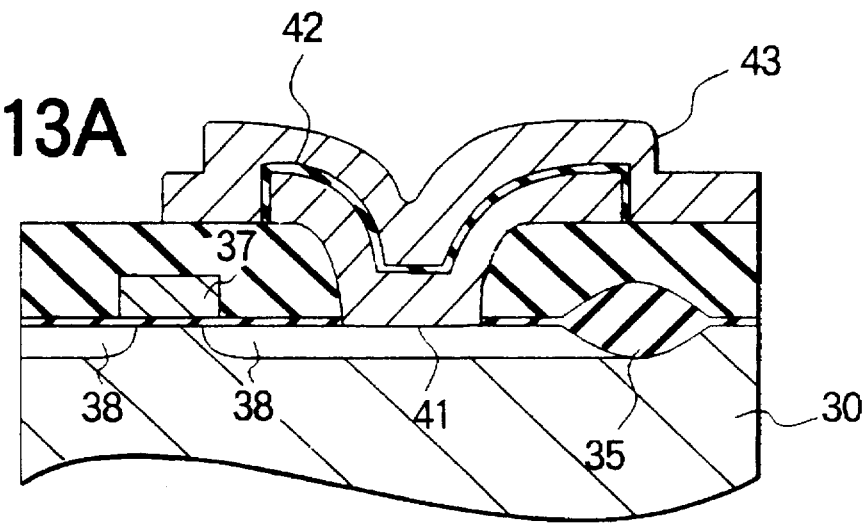
FIGS. 13A and 13B are explanatory cross-sectional views showing the series of processes in a method of semiconductor manufacturing according to Embodiment 5.
Figure 13B:
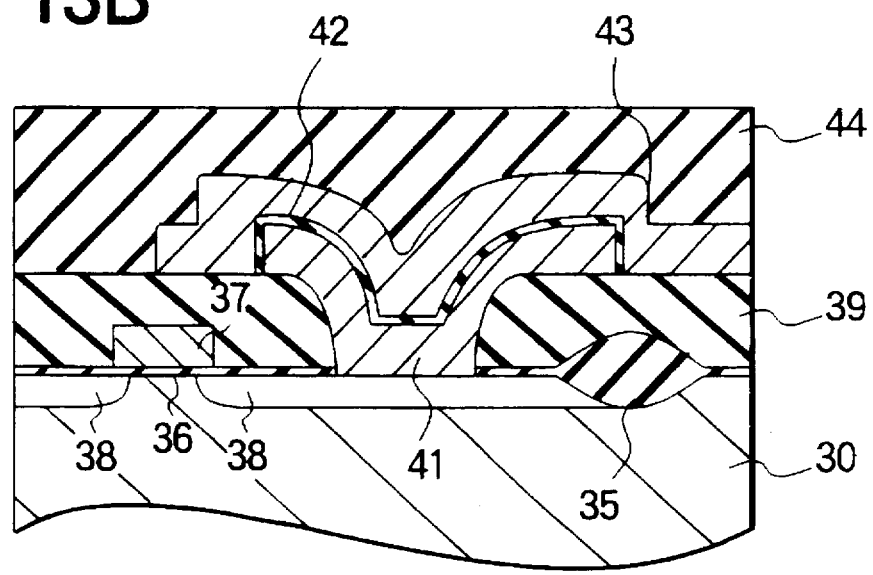
Figure 14:
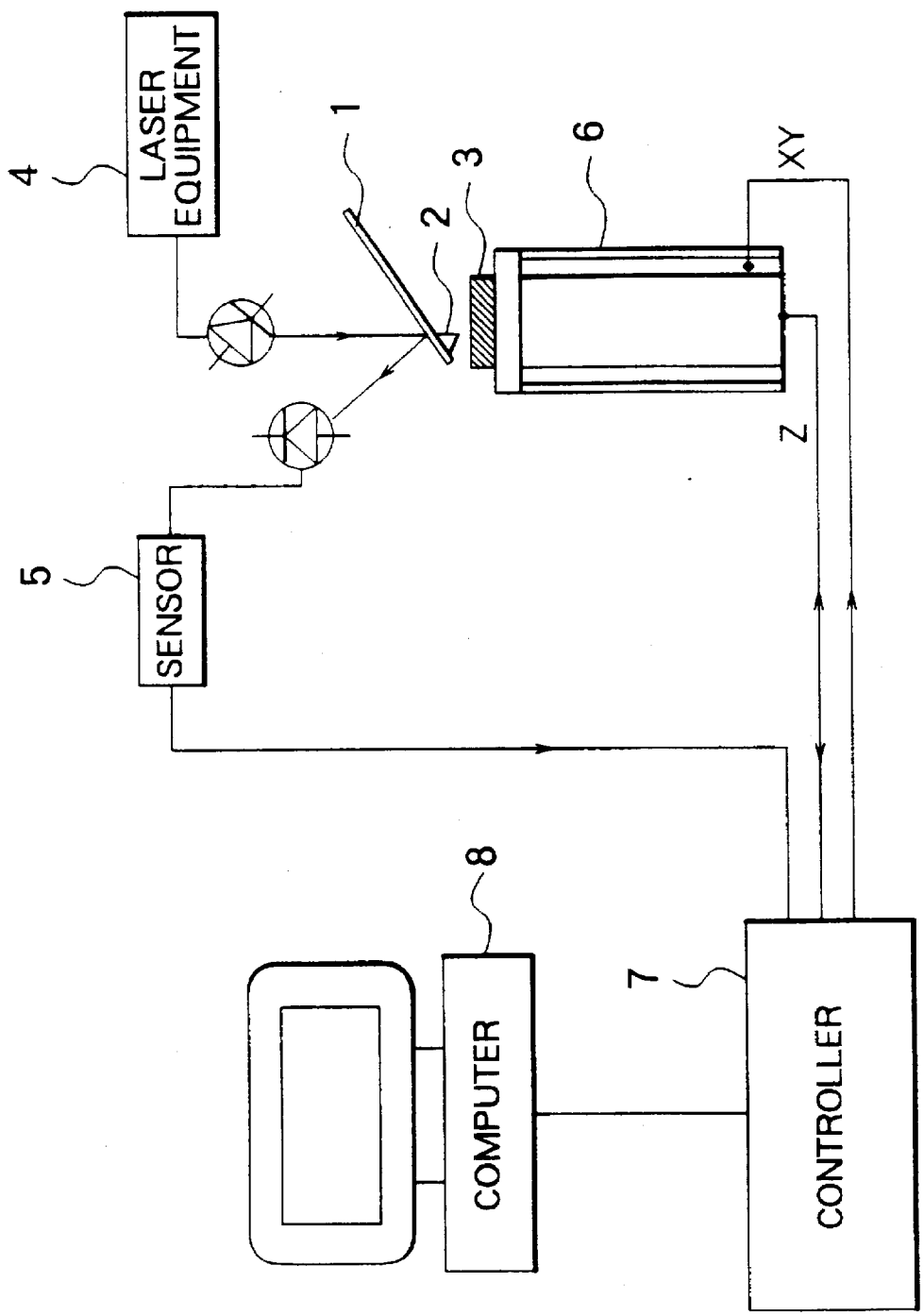
FIG. 14 is a block diagram showing a proposed atomic force microscope.
Figure 15:
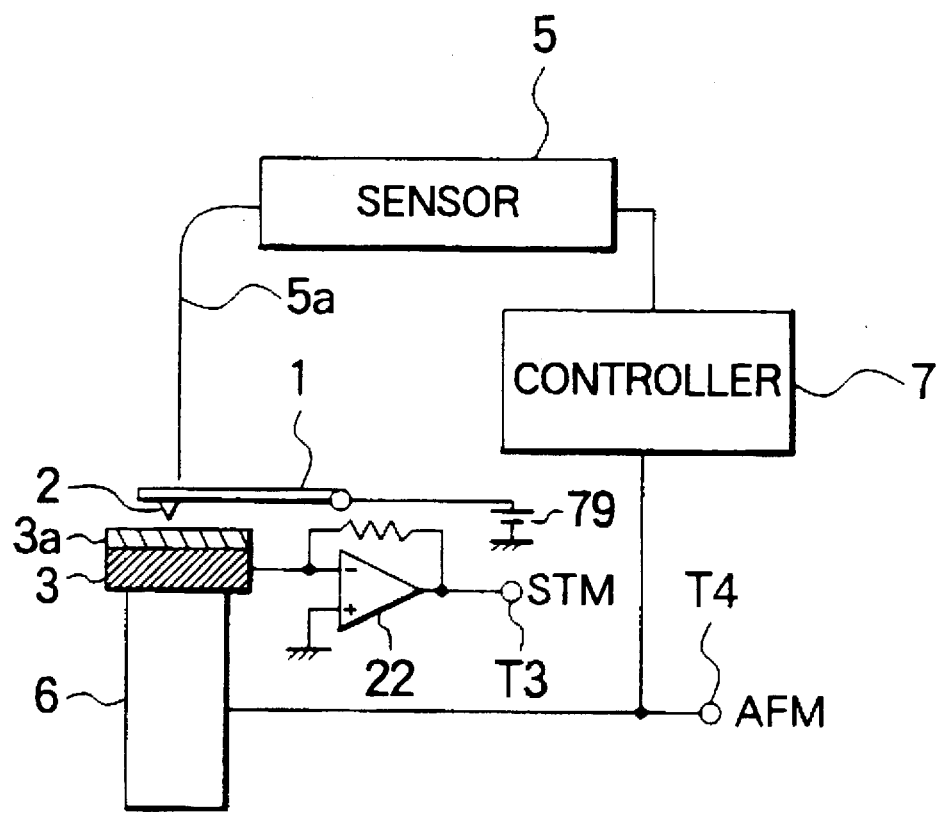
FIG. 15 is a block diagram showing a conventional atomic force microscope that makes electrical measurements.

As shown in FIG. 13A, the upper electrode 43 of the capacitor is formed and an inter-layer film 44 is deposited thereon (FIG. 13B).

In the inspection method described above, dielectric characteristics of each dielectric layer are accurately inspected by measuring surface current distribution of the gate oxide layer or dielectric layers. When the above inspection method is applied to online inspection, semiconductors that fail to satisfy the required dielectric characteristics are judged to be defective early. Thus, an improved efficiency of the semiconductor manufacturing equipment results.

The inspection method described above may be implemented in a production line of semiconductor manufacturing. Alternatively, the inspection method may be used external to the production line.

In each of the above embodiments, a piezoelectric tube element 6 is used to scan and move the sample 3 being measured. Instead of this, a tripod type, a laminated type or a tower-like type element may work equally.

According to the first aspect of the present invention, I/V characteristic data are obtained at each of a plurality of test points on a thin film on the sample surface, and a surface current distribution image is formed based on the I/V characteristic data. This arrangement allows one to understand accurately I/V characteristics for all the test points on the thin film. The present invention thus provides a thin film property analyzing apparatus that measures electrical characteristics of a thin layer in more detail.

According to the second aspect of the present invention, the measuring means measures further surface roughness at the plurality of test points, and the image forming means forms the surface roughness image based on the surface roughness data the measuring means provides and forms the surface current distribution image based on the I/V characteristic data in accordance with the surface roughness image. The surface roughness image is thus correlated with the surface current distribution image. The present invention thus provides a high-performance thin film analyzing apparatus that presents the relationship between the thin film surface roughness and its electrical characteristics.

According to the third aspect of the present invention, the measuring means includes an atomic force microscope having a cantilever with a probe needle on one end, and the atomic force microscope comprises a feedback loop for keeping the probe needle of the cantilever and the thin film a constant separation apart. Further provided is feedback switching means for opening the feedback loop during measurement of the I/V characteristic. This arrangement excludes the influence of a surge current that flows during measurement of the I/V characteristics and thus helps stabilize the operation of the apparatus.

According to the fourth aspect of the present invention, further provided is over-current preventing means for preventing an over-current from flowing through the thin film between the probe needle and the sample during measurement of the I/V characteristics. The analyzing apparatus is thus prevented from being damaged by over-currents. The present invention thus provides a reliable thin film analyzing apparatus.

According to the fifth aspect of the present invention, the electrically conductive coating layer on the cantilever and its probe needle is constructed of an electrically conductive material having a high melting point. The cantilever and the probe needle are thus prevented from melting by over-currents. The present invention thus provides a reliable thin film analyzing apparatus.

According to the sixth aspect of the present invention, I/V characteristics at each of the plurality of test points on the thin film of the sample surface are measured using an atomic force microscope having a cantilever with the probe needle on one end and the surface current distribution image is formed based on I/V characteristic data. This method allows one to understand accurately I/V characteristics on all the test points on the thin film. The present invention thus provides a thin film analyzing method that permits highly accurate measurements of electrical characteristics.

According to the seventh aspect of the present invention, in the method of semiconductor manufacturing, I/V characteristics at each of the plurality of test points on a dielectric layer are measured using the atomic force microscope having the cantilever with the probe needle on its one end and a surface current distribution image is formed based on I/V characteristic data. This method allows one to understand accurately the dielectric characteristic of the dielectric layer. The present invention thus allows one to inspect dielectric characteristics of a dielectric layer formed on a wafer and offers a semiconductor manufacturing method that results in reliable semiconductor devices.

What is claimed is:

1. An apparatus for analyzing a property of a thin film comprising:

measuring means for measuring an I/V characteristic of a thin film disposed on a sample, at each of a plurality of test points on the thin film, the measuring means including:

means for applying a voltage V increasing with time to a maximum voltage across a probe spaced from the thin film and the thin film;

means for detecting a current I flowing between the probe and the thin film in response to the voltage;

means for switching the voltage to zero when the current detected by the means for detecting exceeds a threshold current before the voltage reaches the maximum voltage for preventing excessive current from flowing between the thin film and the probe whereby damage to the probe is avoided; and means for moving the thin film relative to the probe for sequentially and respectively placing the probe opposite each of the test points; and image forming means for forming a surface current distribution image based on the I/V characteristic measured at each of the test points by the measuring means.

2. The apparatus according to claim 1 wherein the measuring means also measures surface roughness at each of the plurality of test points, and the image forming means forms a surface roughness image based on the surface roughness measured by the measuring means.

3. The apparatus according to claim 2 wherein the measuring means includes an atomic force microscope and the probe comprises a cantilever having a needle on one end, the atomic force microscope including a feedback loop for maintaining a constant separation between the needle and the thin film, and feedback switching means for opening the feedback loop during measurement of an I/V characteristic.

4. The apparatus according to claim 3 including an electrically conductive coating having a high melting point and disposed on the cantilever and the needle.

* * * * *